(12) United States Patent
Kim et al.

(10) Patent No.: US 11,373,698 B2
(45) Date of Patent: Jun. 28, 2022

(54) SEMICONDUCTOR DEVICE, SEMICONDUCTOR SYSTEM INCLUDING THE SAME AND OPERATING METHOD FOR A SEMICONDUCTOR SYSTEM

(71) Applicant: SK hynix Inc., Gyeonggi-do (KR)

(72) Inventors: Woongrae Kim, Gyeonggi-do (KR); Tae-Yong Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 274 days.

(21) Appl. No.: 15/987,586

(22) Filed: May 23, 2018

(65) Prior Publication Data
US 2018/0342285 A1    Nov. 29, 2018

(30) Foreign Application Priority Data

May 26, 2017  (KR) .................. 10-2017-0065253
Nov. 28, 2017  (KR) .................. 10-2017-0160649

(51) Int. Cl.
*G11C 16/10* (2006.01)
*G11C 11/406* (2006.01)
(Continued)

(52) U.S. Cl.
CPC ...... *G11C 11/40615* (2013.01); *G11C 7/1063* (2013.01); *G11C 7/222* (2013.01);
(Continued)

(58) Field of Classification Search
CPC ......... G11C 7/1063; G11C 7/22; G11C 7/222; G11C 11/406; G11C 11/40611;
(Continued)

(56) References Cited

U.S. PATENT DOCUMENTS 5,987,614 A    11/1999  Mitchell et al.
6,208,557 B1*  3/2001  Bergemont ........ G11C 16/0408
                                                         257/319
(Continued)

FOREIGN PATENT DOCUMENTS

CN    102866767 A    1/2013
CN    103677082 A    3/2014
(Continued)

OTHER PUBLICATIONS

JEDEC Standard DDR4 SDRAM, JESD79-4, Sep. 2012 JEDEC Solid State Tech. Assoc., pp. 1-204 (Year: 2012).*
Office Action issued by the Chinese Patent Office dated Oct. 11, 2021.

*Primary Examiner* — Xiaochun L Chen
(74) *Attorney, Agent, or Firm* — IP & T Group LLP

(57) ABSTRACT

A semiconductor device includes a monitoring circuit suitable for generating a monitoring signal indicating whether a speed of a memory clock signal is changed based on a speed information signal representing speed information of the memory clock signal; a cycle control circuit suitable for generating a refresh cycle control signal for controlling a refresh cycle based on a system clock signal, the memory clock signal, the monitoring signal and a refresh flag signal; and a control circuit suitable for generating the memory clock signal and the refresh flag signal based on the speed information signal, the system clock signal and the refresh cycle control signal.

19 Claims, 4 Drawing Sheets

(51) Int. Cl.
*G11C 7/22* (2006.01)
*G11C 7/10* (2006.01)
*G11C 11/4093* (2006.01)
*G11C 29/02* (2006.01)
*G11C 11/4076* (2006.01)
*G11C 29/04* (2006.01)

(52) U.S. Cl.
CPC ..... *G11C 11/4093* (2013.01); *G11C 11/40611* (2013.01); *G11C 29/023* (2013.01); *G11C 29/028* (2013.01); *G11C 11/4076* (2013.01); *G11C 2029/0409* (2013.01)

(58) Field of Classification Search
CPC .......... G11C 11/40615; G11C 11/4076; G11C 11/4093; G11C 29/023; G11C 29/028; G11C 2029/0409
See application file for complete search history.

(56) References Cited

U.S. PATENT DOCUMENTS

| | | | |
|---|---|---|---|
| 6,618,310 | B2* | 9/2003 | Higashiho ................ G11C 7/22 |
| | | | 341/144 |
| 6,754,126 | B2 | 6/2004 | Yamaguchi et al. |
| 9,997,222 | B1* | 6/2018 | Ku ........................ G11C 7/222 |
| 2009/0322311 | A1 | 12/2009 | Qi et al. |
| 2011/0055671 | A1 | 3/2011 | Kim et al. |
| 2016/0133314 | A1* | 5/2016 | Hwang ............. G11C 11/40611 |
| | | | 365/189.02 |
| 2017/0285682 | A1* | 10/2017 | Huang ................ G06F 13/1689 |

FOREIGN PATENT DOCUMENTS

| | | |
|---|---|---|
| CN | 105913868 A | 8/2016 |
| CN | 106575961 A | 4/2017 |
| KR | 1020050067520 | 7/2005 |
| KR | 100527552 | 11/2005 |

* cited by examiner

FIG. 7

| COMMAND SIGNAL | CS | CA<0> | CA<0> | CA<0> | CA<0> | CA<0> | CA<0> | CA<0> | CLK_MEM | |
|---|---|---|---|---|---|---|---|---|---|---|
| ACT1 | H | H | H | H | R14 | R15 | R16 | R17 | ↑ | R1 |
|  | X | BA0 | BA1 | BA2 | BA3/C5 | R11 | R12 | R13 | ↓ | F1 |
| ACT2 | H | H | H | L | R7 | R8 | R9 | R10 | ↑ | R1 |
|  | X | R0 | R1 | R2 | R3 | R4 | R5 | R6 | ↓ | F1 |
| PCG (Per Bank, All Banks) | H | L | L | L | H | H | H | H | ↑ | R1 |
|  | X | BA0 | BA1 | BA2 | BA3 | V | V | AB | ↓ | F1 |
| REF (Per Bank, All Banks) | H | L | L | L | H | H | H | L | ↑ | R1 |
|  | X | BA0 | BA1 | BA2 | BA3 | V | V | AB | ↓ | F1 |
| WR | H | L | H | H | C2 | C3 | C4 | C5 | ↑ | R1 |
|  | X | BA0 | BA1 | BA2 | BA3 | C0 | C1 | AP | ↓ | F1 |
| RD | H | H | L | B3 | C2 | C3 | C4 | C5 | ↑ | R1 |
|  | X | BA0 | BA1 | BA2 | BA3/B4 | C0 | C1 | AP | ↓ | F1 |

SEMICONDUCTOR DEVICE, SEMICONDUCTOR SYSTEM INCLUDING THE SAME AND OPERATING METHOD FOR A SEMICONDUCTOR SYSTEM

CROSS-REFERENCE TO RELATED APPLICATIONS

This application claims priority under 35 U.S.C. § 119 to Korean Patent Application No. 10-2017-0065253, filed on May 26, 2017, and Korean Patent Application No. 10-2017-0160649, filed on Nov. 28, 2017, the disclosures of which are incorporated herein by reference in its entirety.

BACKGROUND

1. Field

Various embodiments of the present disclosure relate to a semiconductor design technique, and more particularly, to a semiconductor device, a semiconductor system including the semiconductor device, and an operating method of the semiconductor system.

2. Description of the Related Art

As semiconductor technology develops, diverse functions would be required for a semiconductor system. For example, a semiconductor system has been developed to support an operation in both a high-speed mode and a low-speed mode. The high-speed mode and the low-speed mode may relate to a clock signal. That is, the semiconductor system may operate in synchronization with the clock signal and act in the high-speed mode or the low-speed mode determined according to the speed, i.e., a frequency, of the clock signal. Further, the semiconductor system may operate in synchronization with a rising edge and a falling edge of the clock signal in the high-speed mode or the low-speed mode. However, in a time domain, when the operation mode is switched from the low-speed mode to the high-speed mode, an operation performed in a previous mode before the switching (e.g., the low-speed mode) may overlap with an operation performed in a current mode after the switching (e.g., the high-speed mode), which may cause a problem. Therefore, a technique capable of ensuring a stable operation in transition from the low-speed mode to the high-speed mode.

SUMMARY

Various embodiments of the present disclosure are directed to a semiconductor device that may control a refresh cycle in response to the speed (i.e., a frequency) of a clock signal, a semiconductor system including the semiconductor device, and an operating method of the semiconductor system.

In an embodiment of the present disclosure, a semiconductor device may include: a monitoring circuit suitable for generating a monitoring signal indicating whether a speed of a memory clock signal is changed based on a speed information signal representing speed information of the memory clock signal; a cycle control circuit suitable for generating a refresh cycle control signal for controlling a refresh cycle based on a system clock signal, the memory clock signal, the monitoring signal and a refresh flag signal; and a control circuit suitable for generating the memory clock signal and the refresh flag signal based on the speed information signal, the system clock signal and the refresh cycle control signal.

In an embodiment of the present disclosure, a semiconductor system may include: a control device suitable for generating a memory clock signal having a predetermined speed and generating a memory command signal at a moment when a refresh cycle which is controlled corresponding to a speed of the memory clock signal is considered, based on a system clock signal and a system command signal; and a memory device suitable for performing a predetermined operation, determined based on the memory command signal, with an operational speed corresponding to the memory clock signal.

In an embodiment, an operating method of a semiconductor system may include: monitoring whether a speed of a memory clock is changed during a refresh operation; and generating a predetermined command signal according to a monitoring result, wherein: when the speed of the memory clock corresponds to a reference speed, the predetermined command signal is generated after a first refresh cycle from a moment when a refresh command signal for controlling the refresh operation is generated; and when the speed of the memory clock is higher than the reference speed, the predetermined command signal is generated after a second refresh cycle that is longer than a first refresh cycle from another moment when the refresh command signal is generated.

Other applications of the disclosure will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein:

FIG. 7 is a table where command signals are combined to determine which operation is performed.

DETAILED DESCRIPTION

Various embodiments of the present disclosure will be described in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Figure 1:
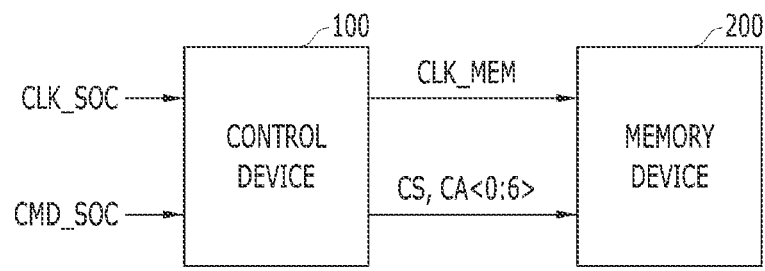
FIG. 1 is a block diagram illustrating a semiconductor system in accordance with an embodiment of the present disclosure.

Referring to FIG. 1 which illustrates a semiconductor system in accordance with an embodiment of the present disclosure, the semiconductor system may include a control device 100 and a memory device 200.

The control device 100 may generate a memory clock signal CLK_MEM and a plurality of command signals CS, CA<0:6> in order for controlling the memory device 200 based at least on a system clock signal CLK_SOC and a system command signal CMD_SOC. For example, the control device 100 may divide or multiply a frequency of the system clock signal CLK_SOC to generate the memory clock signal CLK_MEM based on the system command signal CMD_SOC. In addition, the control device 100 may generate the command signals CS, CA<0:6>, used for controlling at least one of a refresh operation, an active operation, a precharge operation, a write operation and a read operation of the memory device 200, based on the memory clock signal CLK_MEM and the command signal CMD_SOC. Particularly, the control device 100 may take a refresh cycle into account to generate the command signals CS, CA<0:6>. The refresh cycle may be determined according to a speed, i.e., a frequency of the memory clock signal CLK_MEM.

The system command signal CMD_SOC may include a speed information signal which represents speed information, i.e., frequency information of the memory clock signal CLK_MEM. For example, the system clock signal CLK_SOC and the system command signal CMD_SOC may be provided from a host device (not illustrated in FIG. 1). In another example, the control device 100 may include a controller such as a central processing unit (CPU).

The memory device 200 may perform a predetermined operation based on the memory clock signal CLK_MEM and the command signals CS, CA<0:6>. For example, the memory device 200 may include a DRAM that performs the refresh operation, the active operation, the precharge operation, the write operation, the read operation, and so on.

Figure 2:
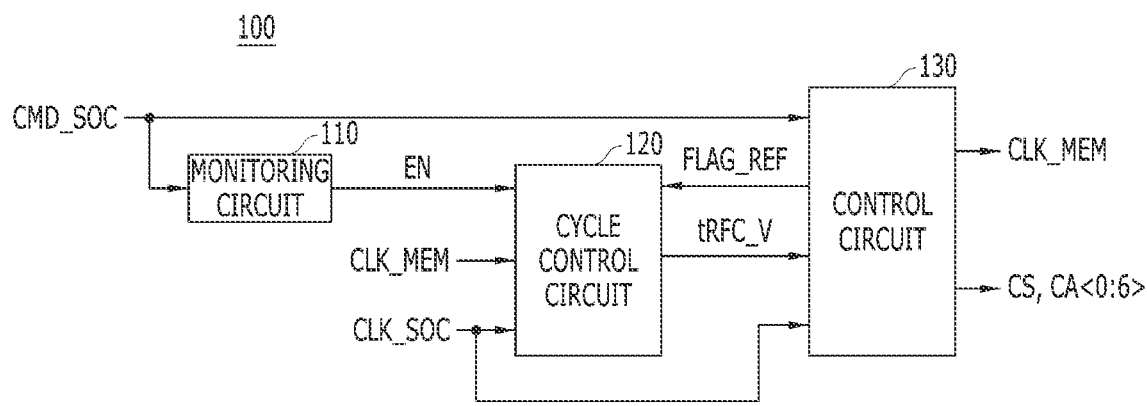
FIG. 2 is a block diagram illustrating a control device shown in FIG. 1.

FIG. 2 is a block diagram illustrating the control device 100 shown in FIG. 1.

Referring to FIG. 2, the control device 100 may include a monitoring circuit 110, a cycle control circuit 120, and a control circuit 130.

The monitoring circuit 110 may generate a monitoring signal EN indicating a speed change (or frequency change) of the memory clock signal CLK_MEM, which may be recognized based on the system command signal CMD_SOC. For example, the monitoring circuit 110 may activate the monitoring signal EN when the current speed of the memory clock signal CLK_MEM is higher than a previous speed.

The cycle control circuit 120 may generate a refresh cycle control signal tRFC_V having a period, a section or a cycle corresponding to the refresh cycle, based at least on the system clock signal CLK_SOC, the memory clock signal CLK_MEM, the monitoring signal EN and a refresh flag signal FLAG_REF.

The control circuit 130, receiving the system command signal CMD_SOC, the system clock signal CLK_SOC and the refresh cycle control signal tRFC_V, may generate the memory clock signal CLK_MEM, the command signals CS, CA<0:6> and the refresh flag signal FLAG_REF. The memory clock signal CLK_MEM may have a frequency corresponding to (or representing) the speed information. The command signals CS, CA<0:6> may be generated at a moment when the refresh cycle is considered. The command signals CS, CA<0:6> may be generated in synchronization with the memory clock signal CLK_MEM. The command signals CS, CA<0:6> may be combined to determine which operation is performed as shown in FIG. 7.

Referring to FIG. 7, the command signals CS, CA<0:6> may include a refresh signal REF for controlling the refresh operation, active signals ACT1 and ACT2 for controlling the active operation, a precharge signal PCG for controlling the precharge operation, a write signal WR for controlling the write operation, and a read signal RD for controlling the read operation. Since the number of cases ($2^8$) according to the number of 8-bit signals (i.e., CS and CA<0:6>) is limited, the command signals CS, CA<0:6> may be generated or activated twice for a single operation. For example, a first refresh signal REF1 may be generated in synchronization with a rising edge R1 of the memory clock signal CLK_MEM, and a second refresh signal REF2 may be subsequently generated in synchronization with a falling edge F1 of the memory clock signal CLK_MEM. The second refresh signal REF2 may include information AB indicating a type of the refresh operation. For example, the information AB may indicate any one of a per-bank refresh operation and all-banks refresh operation. The refresh flag signal FLAG_REF may be activated when the command signals CS, CA<0:6> are generated as the refresh signal REF.

Figure 3:
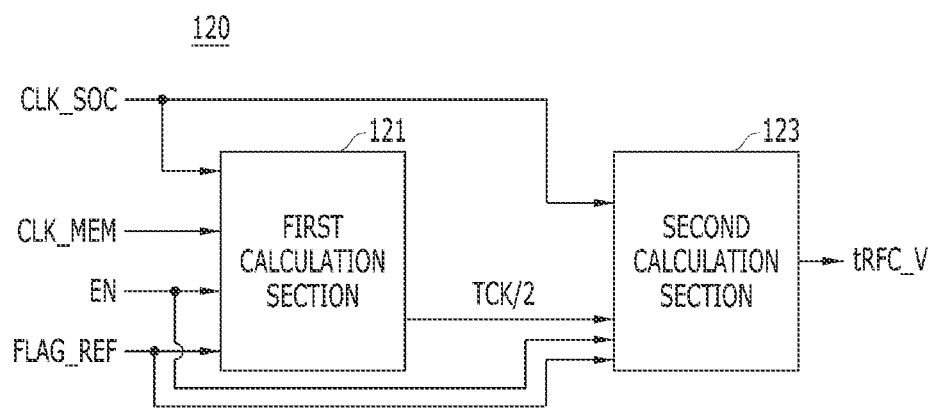
FIG. 3 is a block diagram illustrating a cycle control circuit shown in FIG. 2.

FIG. 3 is a block diagram illustrating the cycle control circuit 120 shown in FIG. 2.

Referring to FIG. 3, the cycle control circuit 120 may include a first calculation section 121 and a second calculation section 123.

The first calculation section 121 may calculate a control value of the refresh cycle, based on at least one of the system clock signal CLK_SOC, the memory clock signal CLK_MEM, the monitoring signal EN and the refresh flag signal FLAG_REF, and generate a first calculation signal TCK/2 corresponding to the calculation result. For example, the first calculation section 121 may determine a half (½) cycle of the memory clock signal CLK_MEM as the control value.

The second calculation section 123 may generate the refresh cycle control signal tRFC_V based on the system clock signal CLK_SOC and the first calculation signal TCK/2. For example, the second calculation section 123 may generate the refresh cycle control signal tRFC_V corresponding to any one of a predetermined reference value and the calculated control value.

Figure 4:
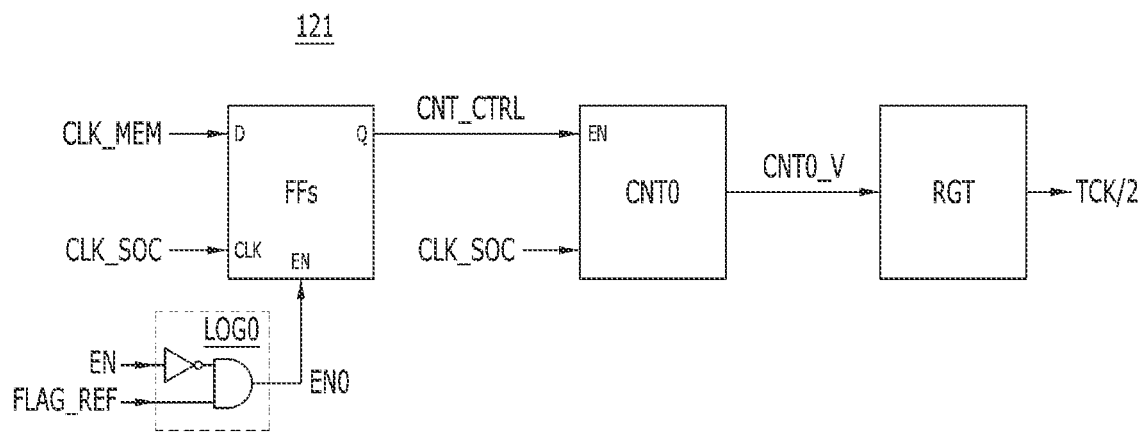
FIG. 4 is a block diagram illustrating a first calculation block shown in FIG. 3.

FIG. 4 is a block diagram illustrating the first calculation section 121 shown in FIG. 3.

Referring to FIG. 4, the first calculation section 121 may include a first enable block LOG0, a calculation control block FFs, a first count block CNT0, and a storing block RGT.

The first enable block LOG0 may generate a first enable signal EN0, which is activated during a period before the speed of the memory clock signal CLK_MEM is changed, based on the monitoring signal EN and the refresh flag signal FLAG_REF. For example, the first enable block LOG0 may include an inverter for inverting the monitoring signal EN, and a logic AND gate for performing an AND operation onto an output signal of the inverter and the refresh flag signal FLAG_REF to generate the first enable signal EN0.

The calculation control block FFs may generate a count control signal CNT_CTRL, which is activated during a count period corresponding to the half (½) cycle of the memory clock signal CLK_MEM, based on the first enable signal EN0, the memory clock signal CLK_MEM and the system clock signal CLK_SOC. For example, the calculation control block FFs may include a D flip-flop. The D flip-flop is enabled based on the first enable signal EN0 and generates the count control signal CNT_CTRL, which corresponds to a logic level of the memory clock signal CLK_MEM, based on the system clock signal CLK_SOC.

The first count block CNT0 may count the system clock signal CLK_SOC during the count period based on the count control signal CNT_CTRL and generate a count signal CNT0_V corresponding to a result of the count. For example, the first count block CNT0 may include a counter.

The storing block RGT may store the count signal CNT0_V as the first calculation signal TCK/2. For example, the storing block RGT may include a register.

Figure 5:
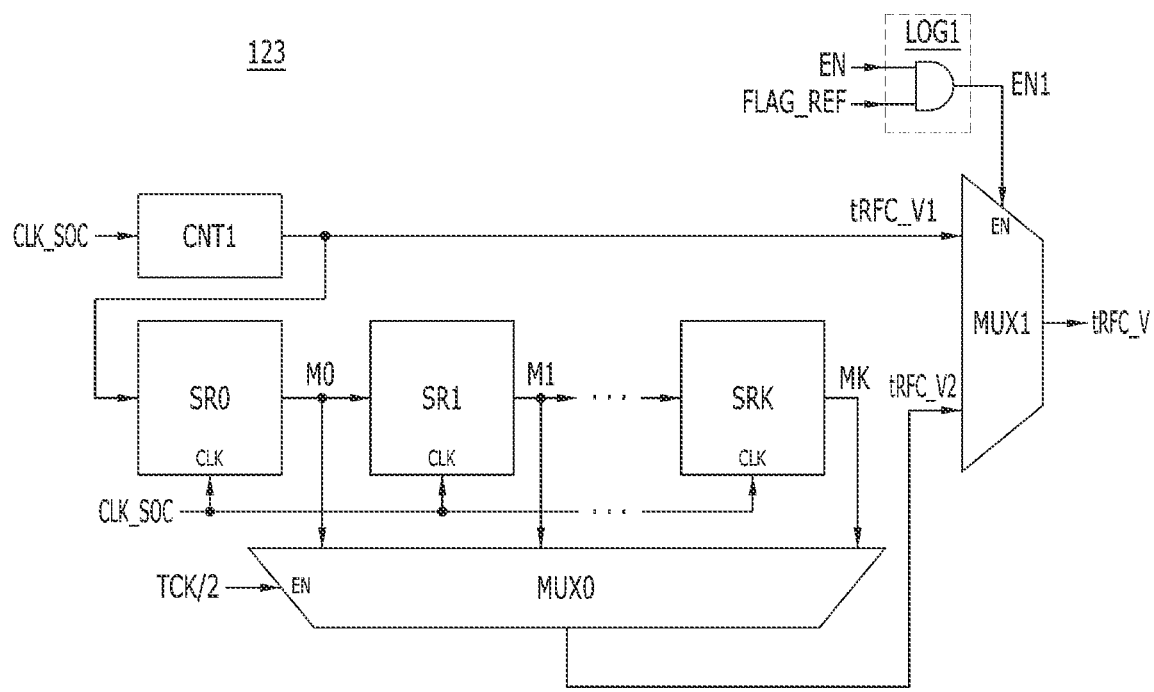
FIG. 5 is a block diagram illustrating a second calculation block shown in FIG. 3.

FIG. 5 is a block diagram illustrating the second calculation section 123 shown in FIG. 3.

Referring to FIG. 5, the second calculation section 123 may include a second count block CNT1, a plurality of shifting blocks SR0 to SRK, a first selection block MUX0, a second enable block LOG1, and a second selection block MUX1.

The second count block CNT1 may count the system clock signal CLK_SOC to generate a first cycle control signal tRFC_V1 corresponding to the reference value. For example, the second count block CNT1 may include a counter.

The shifting blocks SR0, . . . , SRK (K is a positive integer) may sequentially shift the first cycle control signal tRFC_V1 by a unit control value based on the system clock signal CLK_SOC to generate a plurality of shifting signals M0, . . . , MK (K is a positive integer). For example, each of the shifting blocks SR0 to SRK may include a shift register. The shifting blocks SR0 to SRK may be coupled in series to each other. In this case, a first shifting block SR0 arranged at a front end among the shifting blocks SR0 to SRK may shift the first cycle control signal tRFC_V1 by the unit control value based on the system clock signal CLK_SOC to generate a first shifting signal M0 among the shifting signals M0 to MK. Second to $(K+1)^{th}$ shifting blocks SR1 to SRK among the shifting blocks SR0 to SRK may shift the first to Kth shifting signals M0 to MK−1 generated from the first to Kth shifting blocks SR0 to SRK−1 arranged at front ends of the second to $(K+1)^{th}$ shifting blocks SR1 to SRK by the unit control value based on the system clock signal CLK_SOC to generate second to $(K+1)^{th}$ shifting signals M1 to MK.

The first selection block MUX0 may select any one of the shifting signals M0 to MK, based on the first calculation signal TCK/2, as a second cycle control signal tRFC_V2. For example, the first selection block MUX0 may include a multiplexer.

The second enable block LOG1 may generate a second enable signal EN1 reflecting both whether the speed of the memory clock signal CLK_MEM is changed and whether the refresh operation is performed, based on the monitoring signal EN and the refresh flag signal FLAG_REF. For example, the second enable block LOG1 may include a logic AND gate for performing an AND operation onto the monitoring signal EN and the refresh flag signal FLAG_REF to generate the second enable signal EN1.

The second selection block MUX1 may select any one of the first and second cycle control signals tRFC_V1 and tRFC_V2 as the refresh cycle control signal tRFC_V, based on the second enable signal EN1. For example, the second selection block MUX1 may include a multiplexer.

Hereinafter, an operation of the semiconductor system having the aforementioned structure will be described with reference to FIG. 6.

Figure 6:
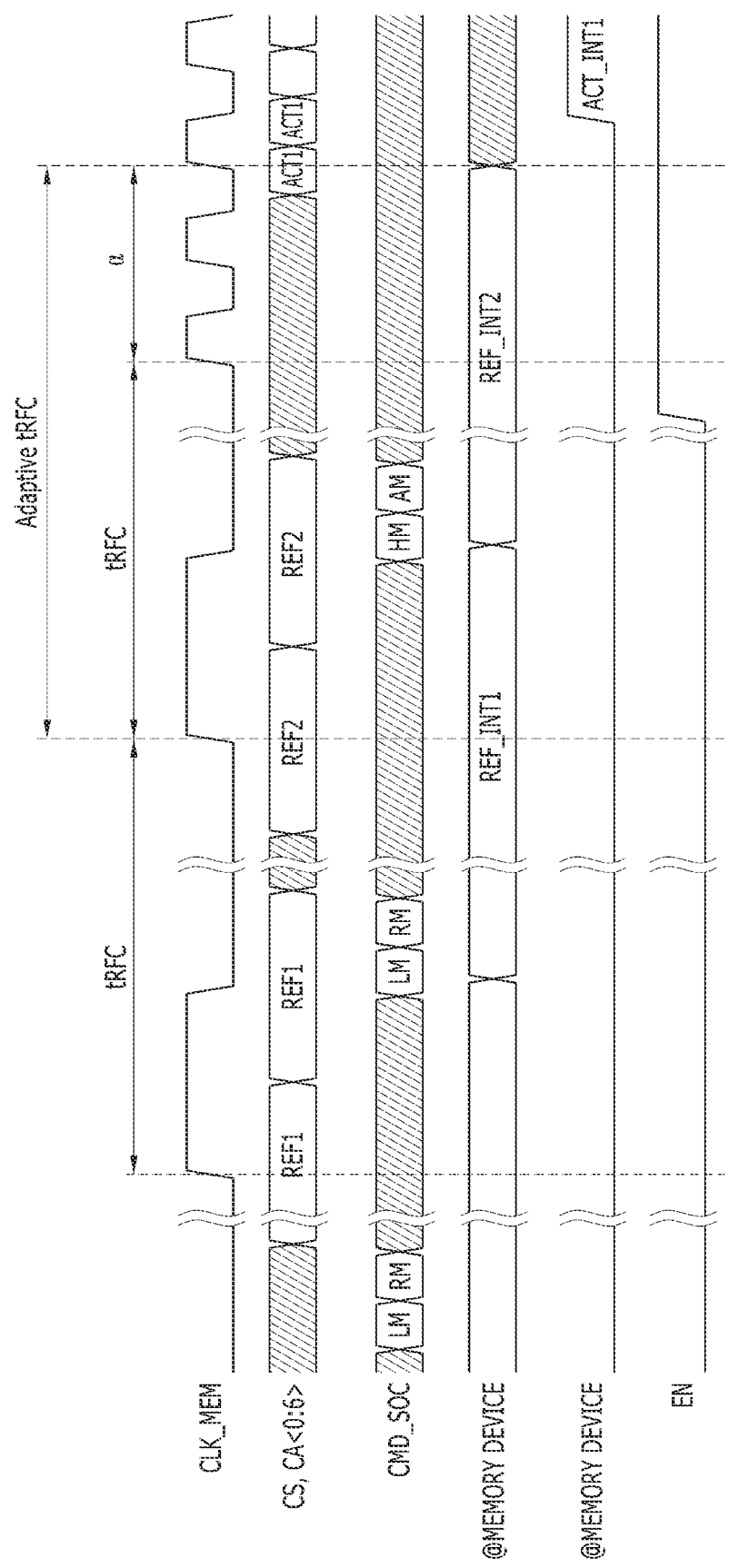
FIG. 6 is a timing diagram illustrating an operation of a semiconductor system shown in FIG. 1.

FIG. 6 is a timing diagram illustrating an operation of the semiconductor system shown in FIG. 1.

Referring to FIG. 6, the monitoring circuit 110 may generate the monitoring signal EN indicating whether the speed of the memory clock signal CLK_MEM is changed, based on the speed information included in the system command signal CMD_SOC. For example, when the speed information includes low-speed information LM corresponding to a low-speed mode, the monitoring circuit 110 may continuously deactivate the monitoring signal EN.

The cycle control circuit 120 may generate the refresh cycle control signal tRFC_V corresponding to the low-speed mode based on the system clock signal CLK_SOC, the memory clock signal CLK_MEM, the monitoring signal EN and the refresh flag signal FLAG_REF.

The control circuit 130 may generate the memory clock signal CLK_MEM, the command signals CS, CA<0:6> and the refresh flag signal FLAG_REF based on the system command signal CMD_SOC, the system clock signal CLK_SOC and the refresh cycle control signal tRFC_V. For example, the control circuit 130 may generate the memory clock signal CLK_MEM having a lower speed (i.e., a low frequency) than the system clock signal CLK_SOC based on the low-speed information LM included in the system command signal CMD_SOC. In addition, the control circuit 130 may generate the command signals CS, CA<0:6> corresponding to a first refresh operation and activate the refresh flag signal FLAG_REF, based on refresh information RM included in the system command signal CMD_SOC. The control circuit 130 may generate the command signals CS, CA<0:6> as the first refresh signal REF1 in synchronization with a first rising edge of the memory clock signal CLK_MEM corresponding to a predetermined moment, and then generate the command signals CS, CA<0:6> as the first refresh signal REF1 in synchronization with a first falling edge of the memory clock signal CLK_MEM. Since the number of cases (e.g., 2^8) that may be represented according to the limited number of 8-bit signals (e.g., CS and CA<0:6>) is limited, the command signals CS, CA<0:6> may be generated two times.

The memory device 200 may generate a first internal refresh signal REF_INT1 corresponding to the first refresh signal REF1 based on the command signals CS, CA<0:6> generated two times. If the command signals CS, CA<0:6> are generated and entered the second time, the memory device 200 may generate the first internal refresh signal REF_INT1. It is because the command signals CS, CA<0:6> generated the second time includes information capable of determining whether the refresh operation is the per-bank refresh operation or the all-banks refresh operation. The memory device 200 may perform the per-bank refresh operation or the all-banks refresh operation based on the first internal refresh signal REF_INT1.

Subsequently, when the system command signal CMD_SOC including the low-speed information LM and the refresh information RM is entered, the monitoring circuit 110 may continuously deactivate the monitoring signal EN based on the low-speed information LM.

The cycle control circuit 120 may generate the refresh cycle control signal tRFC_V corresponding to the low-speed mode based on the system clock signal CLK_SOC, the memory clock signal CLK_MEM, the monitoring signal EN and the refresh flag signal FLAG_REF.

The control circuit 130 may generate the memory clock signal CLK_MEM, the command signals CS, CA<0:6> and the refresh flag signal FLAG_REF, based on the system command signal CMD_SOC, the system clock signal CLK_SOC and the refresh cycle control signal tRFC_V. For example, the control circuit 130 may generate the memory clock signal CLK_MEM having a lower speed (i.e., a low frequency) than the system clock signal CLK_SOC based on the low-speed information LM included in the system command signal CMD_SOC. Also, the control circuit 130 may generate the command signals CS, CA<0:6> corresponding to a second refresh operation and activate the refresh flag signal FLAG_REF, based on the refresh information RM included in the system command signal CMD_SOC. The control circuit 130 may generate the command signals CS, CA<0:6> corresponding to the second refresh operation after a refresh cycle tRFC corresponding to the reference value from a moment when the command signals CS, CA<0:6> corresponding to the first refresh operation are generated, based on the refresh cycle control signal tRFC_V. In other words, the control circuit 130 may generate the command signals CS, CA<0:6> as the second refresh signal REF2 in synchronization with a second rising edge of the memory clock signal CLK_MEM corresponding to a moment after the refresh cycle tRFC, and then generate the command signals CS, CA<0:6> as the second refresh signal REF2 in synchronization with a second falling edge of the memory clock signal CLK_MEM. Since the number of cases (e.g., 2^8) that may be represented according to the limited number of signals (e.g., 8) is limited, the command signals CS, CA<0:6> may be generated twice.

The memory device 200 may generate a second internal refresh signal REF_INT2 corresponding to the second refresh signal REF2 based on the command signals CS, CA<0:6> generated twice. When the command signals CS, CA<0:6> are generated and entered the second time, the memory device 200 may generate the second internal refresh signal REF_INT2. This is because the command signals CS, CA<0:6> generated the second time include information capable of determining whether the refresh operation is the per-bank refresh operation or the all-banks refresh operation. The memory device 200 may perform the per-bank refresh operation or the all-banks refresh operation based on the second internal refresh signal REF_INT2.

Subsequently, when the system command signal CMD_SOC including high-speed information HM corresponding to the high-speed mode and active information AM is entered, the monitoring circuit 110 may activate the monitoring signal EN based on the high-speed information HM.

The cycle control circuit 120 may generate the refresh cycle control signal tRFC_V corresponding to the high-speed mode based on the system clock signal CLK_SOC, the memory clock signal CLK_MEM, the monitoring signal EN and the refresh flag signal FLAG_REF. For example, the cycle control circuit 120 may calculate a control value "a" of the refresh cycle, and generate the refresh cycle control signal tRFC_V corresponding to an added-up value of the reference value and the control value "a". The control value "a" may correspond to a half (½) cycle of the memory clock signal CLK_MEM.

The control circuit 130 may generate the memory clock signal CLK_MEM, the command signals CS, CA<0:6> and the refresh flag signal FLAG_REF based on the system command signal CMD_SOC, the system clock signal CLK_SOC and the refresh cycle control signal tRFC_V. For example, the control circuit 130 may generate the memory clock signal CLK_MEM having a higher speed (i.e., a high frequency) than the memory clock signal CLK_MEM of the low-speed mode based on the high-speed information HM included in the system command signal CMD_SOC. Also, the control circuit 130 may generate the command signals CS, CA<0:6> corresponding to a first active operation and deactivate the refresh flag signal FLAG_REF, based on the active information AM included in the system command signal CMD_SOC. The control circuit 130 may generate the command signals CS, CA<0:6> corresponding to the first active operation after a refresh cycle Adaptive tRFC corresponding to the added-up value from a moment when the command signals CS, CA<0:6> corresponding to the first refresh operation are generated, based on the refresh cycle control signal tRFC_V. In other words, the control circuit 130 may generate the command signals CS, CA<0:6> as a first active signal ACT1 in synchronization with a third rising edge of the memory clock signal CLK_MEM corresponding to a moment after the refresh cycle Adaptive tRFC, and then generate the command signals CS, CA<0:6> as the first active signal ACT1 in synchronization with a third falling edge of the memory clock signal CLK_MEM. Since the number of cases (e.g., 2^8) that may be represented according to the limited number of 8-bit signals (e.g., CS and CA<0:6>) is limited, the command signals CS, CA<0:6> may be generated twice.

The memory device 200 may generate a first internal active signal ACT_INT1 corresponding to the first active signal ACT1 based on the command signals CS, CA<0:6> generated twice. Since the first internal active signal ACT_INT1 is activated after the second internal refresh signal REF_INT2 is deactivated, it may prevent the second refresh operation from overlapping (i.e., conflicting) with the first active operation in a time domain.

An operating method for the semiconductor system in accordance with an embodiment of the present disclosure may include monitoring whether or not the speed of the memory clock signal CLK_MEM is changed during the refresh operation, and generating a predetermined command signal based on a monitoring result. For example, the second refresh signal REF2 may be generated after the first refresh cycle, for example, tRFC, from a moment when the refresh signal for controlling the refresh operation, for example, REF1, is generated, when the speed of the memory clock signal CLK_MEM corresponds to the low-speed mode. Or, a predetermined command signal, for example, the first active signal ACT1, may be generated after the second refresh cycle, for example, Adaptive tRFC, that is longer than the first refresh cycle, for example, tRFC, from a moment when the refresh signal, for example, REF2, is generated, when the speed of the memory clock signal CLK_MEM corresponds to the high-speed mode as a monitoring result.

In accordance with the embodiment of the present invention, as the refresh cycle is adjusted according to the speed of the clock signal, a conflict between the refresh operation before the speed of the clock signal is adjusted and a predetermined operation after the speed of the clock signal is adjusted may be prevented. As a result, operational reliability may be improved.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

What is claimed is:

1. A semiconductor device, comprising:
    a monitoring circuit suitable for generating a monitoring signal indicating whether or not a speed of a memory clock signal is changed based on a speed information signal including speed information of the memory clock signal;
    a cycle control circuit suitable for generating a refresh cycle control signal for controlling a refresh cycle based on a system clock signal, the memory clock signal, the monitoring signal and a refresh flag signal; and
    a control circuit suitable for generating the memory clock signal and the refresh flag signal based on the speed information signal, the system clock signal and the refresh cycle control signal.

2. The semiconductor device of claim 1, wherein the control circuit generates a memory command signal based on the refresh cycle, and the memory command signal is inputted to a memory device.

3. The semiconductor device of claim 2, wherein the memory clock signal has a frequency corresponding to the speed information, and the refresh flag signal is activated when the memory command signal is generated as a signal for controlling a refresh operation.

4. The semiconductor device of claim 1, wherein the monitoring circuit activates the monitoring signal when the speed of the memory clock signal is higher than a previous speed.

5. The semiconductor device of claim 1, wherein the cycle control circuit includes:
    a first calculation section suitable for calculating a control value of the refresh cycle and generating a first calculation signal corresponding to a result of the calculation based on the system clock signal, the memory clock signal, the monitoring signal and the refresh flag signal; and
    a second calculation section suitable for generating the refresh cycle control signal based on the system clock signal and the first calculation signal.

6. The semiconductor device of claim 5, wherein the first calculation section calculates a half (½) cycle of the memory clock signal as the control value.

7. The semiconductor device of claim 5, wherein the first calculation section includes:
    a first enable block suitable for generating a first enable signal which is activated during a time period before the speed of the memory clock signal is change based on the monitoring signal and the refresh flag signal;
    a calculation control block suitable for generating a count control signal which is activated during a count time period corresponding to the half cycle of the memory clock signal based on the first enable signal, the memory clock signal and the system clock signal;
    a first count block suitable for counting the system clock signal during the count time period based on the system clock signal and the count control signal; and
    a storing block suitable for storing the first calculation signal corresponding to a counting result of the first count block.

8. The semiconductor device of claim 5, wherein the second calculation section generates the refresh cycle control signal corresponding to any one of a predetermined reference value and the calculated control value.

9. The semiconductor device of claim 5, wherein the second calculation section includes:
    a second count block suitable for counting the system clock signal to generate a first cycle control signal corresponding to a predetermined reference value of the refresh cycle;
    a plurality of shifting blocks suitable for shifting the first cycle control signal by a unit control value based on the system clock signal to generate a plurality of shifting signals;
    a first selection block suitable for selecting any one of the shifting signals as a second cycle control signal based on the first calculation signal;
    a second enable block suitable for generating a second enable signal reflecting whether or not the speed of the memory clock signal is changed and whether or not a refresh operation is performed, based on the monitoring signal and the refresh flag signal; and
    a second selection block suitable for selecting any one of the first and second cycle control signals as the refresh cycle control signal based on the second enable signal.

10. A semiconductor system, comprising:
    a control device having a first circuit and a second circuit, the first circuit configured to generate a memory clock signal having a predetermined speed and a memory command signal based on a system clock signal and a system command signal, wherein the memory command signal is generated by the first circuit, after a refresh cycle is controlled by the second circuit to correspond to a speed of the memory clock signal; and
    a memory device configured to perform a predetermined operation based on the memory clock signal and the memory command signal, after the second circuit controls the refresh cycle to correspond to the speed of the memory clock signal,
    wherein the control device includes:
    a monitoring circuit configured to generate a monitoring signal indicating whether or not the speed of the memory clock signal is changed based on a speed information signal included in the system command signal, wherein the speed information signal includes speed information of the memory clock signal;
    a cycle control circuit configured to generate a refresh cycle control signal for controlling the refresh cycle based on the system clock signal, the memory clock signal, the monitoring signal and a refresh flag signal; and
    a control circuit configured to generate the memory clock signal and the refresh flag signal based on the speed information signal, the system clock signal and the refresh cycle control signal, wherein the first circuit includes the control circuit, and the second circuit includes the cycle control circuit.

11. The semiconductor system of claim 10, wherein the first circuit of the control device generates a plurality of command signals in synchronization with the memory clock signal.

12. The semiconductor system of claim 10, wherein the memory clock signal has a frequency corresponding to the speed information, and the refresh flag signal is activated when the memory command signal is generated as a signal for controlling a refresh operation.

13. The semiconductor system of claim 10, wherein the monitoring circuit activates the monitoring signal when the speed of the memory clock signal is higher than a previous speed.

14. The semiconductor system of claim 10, wherein the cycle control circuit includes:
   a first calculation section suitable for calculating a control value of the refresh cycle and generating a first calculation signal corresponding to a result of the calculation based on the system clock signal, the memory clock signal, the monitoring signal and the refresh flag signal; and
   a second calculation section suitable for generating the refresh cycle control signal based on the system clock signal and the first calculation signal.

15. The semiconductor system of claim 14, wherein the first calculation section calculates a half (½) cycle of the memory clock signal as the control value.

16. The semiconductor system of claim 14, wherein the first calculation section includes:
   a first enable block suitable for generating a first enable signal which is activated during a time period before the speed of the memory clock signal is change based on the monitoring signal and the refresh flag signal;
   a calculation control block suitable for generating a count control signal which is activated during a count time period corresponding to the half cycle of the memory clock signal based on the first enable signal, the memory clock signal and the system clock signal;
   a first count block suitable for counting the system clock signal during the count time period based on the system clock signal and the count control signal; and
   a storing block suitable for storing the first calculation signal corresponding to a counting result of the first count block.

17. The semiconductor system of claim 14, wherein the second calculation section generates the refresh cycle control signal corresponding to any one of a predetermined reference value and the calculated control value.

18. The semiconductor system of claim 14, wherein the second calculation section includes:
   a second count block suitable for counting the system clock signal to generate a first cycle control signal corresponding to a predetermined reference value of the refresh cycle;
   a plurality of shifting blocks suitable for shifting the first cycle control signal by a unit control value based on the system clock signal to generate a plurality of shifting signals;
   a first selection block suitable for selecting any one of the shifting signals as a second cycle control signal based on the first calculation signal;
   a second enable block suitable for generating a second enable signal reflecting whether or not the speed of the memory clock signal is changed and whether or not a refresh operation is performed, based on the monitoring signal and the refresh flag signal; and
   a second selection block suitable for selecting any one of the first and second cycle control signals as the refresh cycle control signal based on the second enable signal.

19. A semiconductor system comprising:
   a control device configured to generate a memory clock signal having a predetermined speed and a memory command signal on the basis of a system clock signal and a system command signal, and monitor whether or not a speed of the memory clock signal changes based on a speed information signal included in the system command signal, wherein the memory command signal is generated, based on a monitoring result, after a refresh cycle is controlled to correspond to the speed of the memory clock signal; and
   a memory device configured to perform a predetermined operation on the basis of the memory clock signal and the memory command signal.

* * * * *